United States Patent
Estelle

(10) Patent No.: US 6,688,715 B2
(45) Date of Patent: Feb. 10, 2004

(54) LOW IMPEDANCE DIAGNOSTIC FOR GUN DRIVER AND METHOD

(75) Inventor: Peter W. Estelle, Norcross, GA (US)

(73) Assignee: Nordson Corporation, Westlake, OH (US)

( * ) Notice: Subject to any disclaimer, the term of this patent is extended or adjusted under 35 U.S.C. 154(b) by 160 days.

(21) Appl. No.: 09/999,028

(22) Filed: Oct. 31, 2001

(65) Prior Publication Data

US 2002/0135380 A1 Sep. 26, 2002

Related U.S. Application Data

(60) Provisional application No. 60/278,249, filed on Mar. 23, 2001.

(51) Int. Cl.[7] ......................... G01R 31/08; G01R 29/02; H01H 47/00
(52) U.S. Cl. ..................... 324/525; 324/76.79; 324/656; 361/154
(58) Field of Search ................................. 324/525, 600, 324/654, 547, 546, 522, 76.79, 656; 361/152, 154, 170, 178; 251/129.15, 129.04

(56) References Cited

U.S. PATENT DOCUMENTS

| 4,453,652 | A | * | 6/1984 | Merkel et al. | ............... 222/504 |
| 5,666,286 | A | * | 9/1997 | Nojima et al. | ................. 702/57 |
| 6,307,376 | B1 | * | 10/2001 | Alexander et al. | .......... 324/388 |

* cited by examiner

Primary Examiner—Anjan K. Deb
(74) Attorney, Agent, or Firm—Wood, Herron & Evans, L.L.P.

(57) ABSTRACT

An apparatus for detecting a low impedance load on an output of a driver circuit electrically connected to a coil of a fluid dispensing gun. The driver circuit provides a plurality of output signals to the coil in response to respective drive signals. Each drive signal has a waveform commanding the dispensing gun to open, and the waveform has a higher magnitude initial peak period followed by a lower magnitude hold period. A feedback circuit provides a difference signal as a function of a difference between each drive signal and a feedback of a corresponding output signal. A diagnostic circuit is connected to the driver circuit and provides an error signal representing a low impedance error as a function of the difference signal crossing a threshold signal magnitude during an occurrence of the peak period of the drive signal.

36 Claims, 4 Drawing Sheets

LOW IMPEDANCE DIAGNOSTIC FOR GUN DRIVER AND METHOD

This application claims the benefit of U.S. Provisional Application No. 60/278,249 entitled "LOW IMPEDANCE DIAGNOSTIC FOR GUN DRIVER AND METHOD", filed on Mar. 23, 2001.

FIELD OF THE INVENTION

The present invention generally relates to an apparatus and method for dispensing fluids and more specifically, to a gun driver diagnostic circuit for a fluid dispensing apparatus.

BACKGROUND OF THE INVENTION

Pneumatic and electric fluid dispensers have been developed for dispensing applications requiring a precise placement of a fluid. Pneumatic dispensers have a significant advantage in that the pneumatic solenoid operating the dispensing valve provides a sufficient force so that the dispensing valve operation is essentially independent of the viscosity of the fluid being dispensed. However, pneumatic solenoids have disadvantages in that they often have a shorter life than electric solenoids, and the operation of the pneumatic solenoid is subject to less precise control than the electric solenoid in an electric fluid dispenser. Therefore, in some applications, electrically operated fluid dispensers are preferred over pneumatic fluid dispensers.

Generally, electrically operated fluid dispensers include an electromagnetic coil surrounding an armature that is energized to produce an electromagnetic field with respect to a magnetic pole. The electromagnetic field is selectively controlled to open and close a dispensing valve by moving a valve stem connected to the armature. More specifically, the forces of magnetic attraction between the armature and the magnetic pole move the armature and valve stem toward the pole, thereby opening the dispensing valve. At the end of a dispensing cycle, the electromagnet is de-energized, and a return spring returns the armature and valve stem to their original positions, thereby closing the dispensing valve.

With both pneumatic and electric dispensing guns, a driver circuit provides an output signal to an inductive load, either a solenoid coil in a pneumatic gun or a gun-operating coil in an electric gun. Changing electrical characteristics of the load or output circuit connected to the driver circuit may result in inconsistent and improper operation of the coil being driven by the driver circuit and hence, the operation of the fluid dispensing gun is adversely affected.

For example, the output circuit may be improperly wired or, wires may be damaged such that a low resistance load is connected on the driver circuit. Many driver circuits are made to withstand short circuit conditions and therefore, are not damaged by an excessively low resistance or impedance load. However, while the driver circuit may not be damaged, it is useful to be able to detect and signal the user of the above low impedance conditions so that corrective action can be taken.

In other situations, the driver circuit may be connected to a dispensing gun with a coil having an impedance that is mismatched to the output impedance of the driver circuit. While some impedance mismatching is acceptable, excessive impedance mismatching can result in an inconsistent operation of the fluid dispensing gun.

Further, over a prolonged operating period, heat in the dispensing gun can cause wire insulation to slowly degrade. Such degradation can cause windings within the coil to arc and degrade into a short circuit condition. As coil windings degrade, the resistance and inductance of the coil decreases, and the impedance is further reduced. That process may adversely affect the operation of the dispensing gun.

Consequently, there is a need for a diagnostic circuit for use with a driver circuit of a fluid dispensing gun that detects and alerts a user to lower output circuit impedances that can may either immediately, or over a period of time, adversely effect the operation of the fluid dispensing gun.

SUMMARY OF THE INVENTION

The present invention provides a simple and reliable diagnostic circuit for a driver output circuit of a fluid dispensing gun that is sensitive to a wide range of low impedance conditions. The diagnostic circuit of the present invention is capable of signaling the user of deteriorating electrical characteristics in the driver output circuit that may result in an inconsistent operation of the fluid dispensing gun. The diagnostic circuit of the present invention also signals the user in the event the user attempts to use a dispensing gun presenting a severe impedance mismatch with the output of the driver circuit. The diagnostic circuit of the present invention is especially useful in providing signals, in a timely manner, that apprise the user of conditions that may result in an improper or inconsistent operation of the dispensing gun. Thus, the user can address the condition in a timely manner and reduce the production of defective or scrap product.

According to the principles of the present invention and in accordance with the preferred embodiments, the invention provides an apparatus for detecting a low impedance load on the output of a driver circuit. The driver circuit has a power switching circuit providing output signals to a coil. Each output signal results from a drive signal that has a waveform comprising a higher magnitude initial peak period followed by a lower magnitude hold period. The apparatus comprises a diagnostic circuit connected to the driver circuit. The diagnostic circuit provides a low impedance error signal in response to detecting an output signal oscillation that crosses a signal threshold during a corresponding drive signal.

In one aspect of the invention, the driver circuit has a feedback circuit providing a difference signal as a function of a difference between an output signal and a corresponding drive signal, and the diagnostic circuit has a comparator responsive to the difference signal for producing a low impedance error signal in response to detecting an output signal oscillation that crosses a magnitude of the reference signal.

In another aspect of the invention, the diagnostic circuit has a first circuit connected to the driver circuit for providing a gating signal representing a higher magnitude initial peak period of a drive signal. A second circuit is connected to the comparator and the first circuit for producing the low impedance error signal during only the higher magnitude initial peak period of the drive signal.

In another embodiment of the invention, a method is provided for detecting a low impedance load on an output of a driver circuit that is connected to a coil. The driver circuit applies output signals to the coil in response to corresponding drive signals. Each drive signal has a waveform with a higher magnitude initial peak period followed by a lower magnitude hold period. An error signal is provided in response to detecting an output signal oscillation that crosses a signal threshold during a corresponding drive signal.

In one aspect of this invention, the error signal is provided in response to detecting an output signal oscillation that crosses a signal threshold during a higher magnitude initial peak period of the corresponding drive signal.

These and other objects and advantages of the present invention will become more readily apparent during the following detailed description taken in conjunction with the drawings herein.

DETAILED DESCRIPTION OF THE INVENTION

Figure 1:
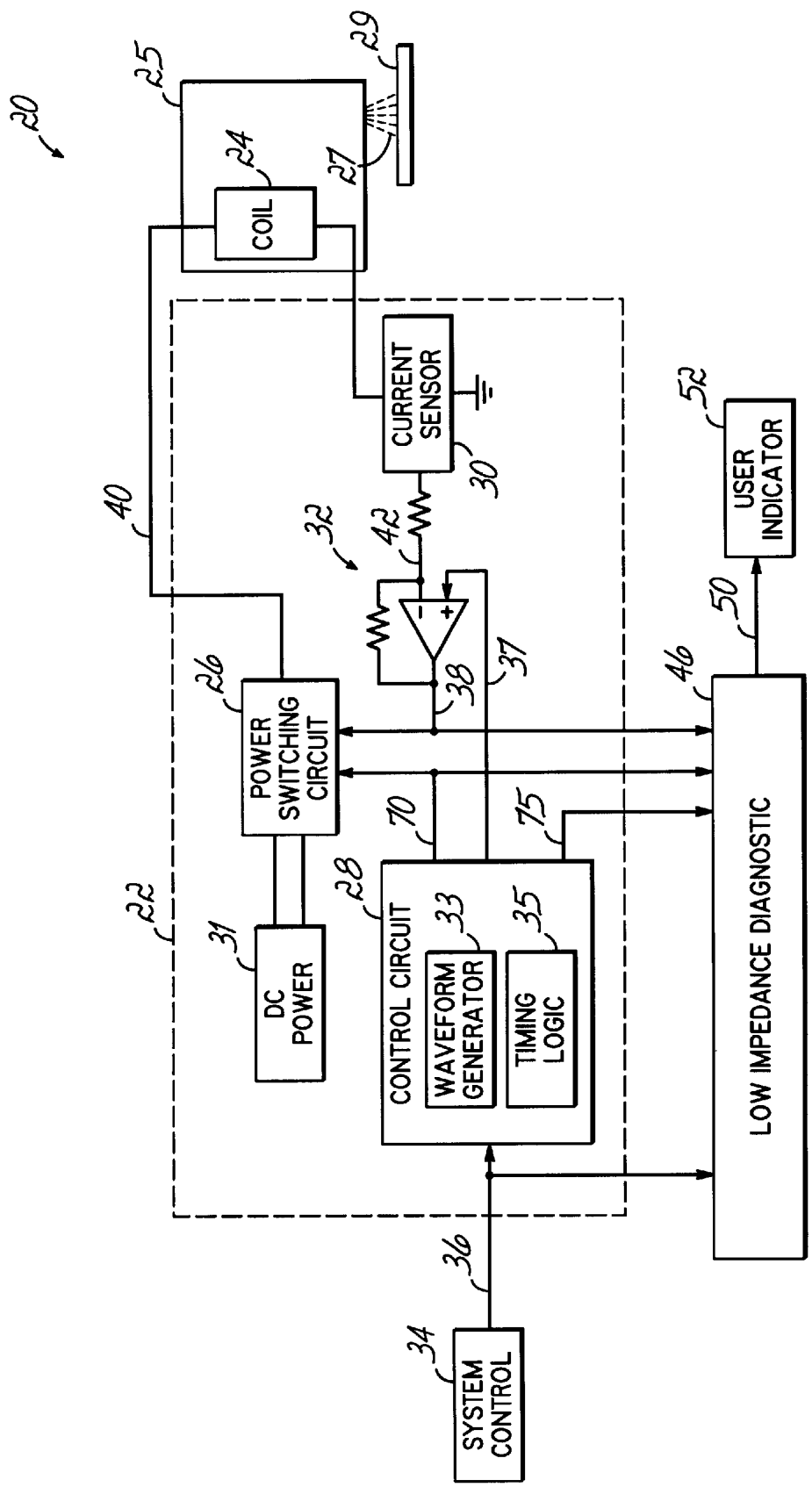
FIG. 1 is a schematic block diagram of a driver circuit and a diagnostic circuit for a fluid dispensing gun in accordance with the principles of the present invention.

Referring to FIG. 1, a portion of a fluid dispensing system 20 is comprised of a gun controller or gun driver circuit 22 electrically connected to a system control 34 and an output circuit 23 that includes a coil 24 and wires, connectors and other associated circuit elements not shown in detail. The coil 24 may be the coil of a solenoid in a pneumatic dispensing gun or a gun coil in an electric dispensing gun. In either application, the coil is used to operate the dispensing gun 25, thereby dispensing a fluid 27 onto a substrate 29. The driver circuit 22 comprises a DC power source 31, power switching circuit 26, a control circuit 28 and a feedback circuit 32. The control circuit 28 normally has a waveform generator 33 and timing logic 35. The system control 34 includes other known dispensing system or machine controls (not shown) necessary for the operation of the dispensing system 20, for example, a pattern control, and provides a trigger signal on an output 36. The system control 34 also includes input devices (not shown) such as a keypad, pushbuttons, etc. and output devices such as a display, indicator lights, a relay, etc. that provide communication links with a user in a known manner.

The waveform generator 33 provides a drive signal to one input 37 of a feedback amplifier 39 of the feedback circuit 32, and a difference signal on an output 38 of the feedback amplifier 39 is used to drive the power switching circuit 26. The power switching circuit 26 is connected to the source of DC power 31 that may be regulated or unregulated. The power switching circuit 26 is operated with a pulse width modulator or other known means (not shown) and applies an output signal to the output circuit 23 of the coil 24. The output signal from the power switching circuit 26 also normally has a waveform corresponding to the desired waveform of the drive signal.

The feedback circuit 32 further includes a current sensor 30 that is electrically connected to the coil 24 and provides a feedback signal representing current in the coil 24. The current sensor 30 can be implemented with any one of many current measuring devices and methods, for example, a simple resistor, a Hall effect device, etc. The feedback amplifier 39 has a second input 42 connected to an output of the current sensor 30. Thus, the feedback amplifier 39 provides a difference signal on output 38 representing a difference between a desired waveform of the drive signal provided by the waveform generator 33 and a waveform of the feedback signal from the current sensor 30.

The fluid dispensing system 20 is operated in response to a trigger pulse supplied on an output 36 from the system control 34. With each trigger pulse, the waveform generator 33 provides a drive signal having a stepped waveform. That general waveform is found in the difference signal provided by the error amplifier and used to drive the power switching circuit 26. Thus, the power switching circuit 26 provides to the coil 24 an output signal having a current waveform as generally illustrated by the waveform 44 of FIG. 2.

In the operation of a fluid dispensing gun, in order to achieve the highest actuation speed, a current pulse or spike is typically provided to the coil during an initial turn on period in order to initiate operation of the coil armature as quickly as possible. After the initial current pulse, the current through the coil is then reduced to approximately the minimum value required to hold the armature in its open position against the opposing force of a return spring. Such a stepped current waveform provides high performance while minimizing power dissipation in the coil. Thus, to open the dispensing gun, the current waveform 44 provides an initial current magnitude $I_{pk}$ for a duration or period of time $T_{pk}$ in response to a trigger pulse. Thereafter, the current is reduced to a lesser hold level $I_h$ for the remaining period of the on-time $T_{on}$. To close the dispensing gun, a lesser current value is then maintained for an off-time $T_{off}$ during the remaining time of the current waveform period $T_p$. During the off-time, the current value may be substantially zero or some other value insufficient to operate the coil 24. The values of $I_{pk}$ and $T_{pk}$ are often chosen as a function of the application requirements, for example, the viscosity of the fluid being dispensed. Further, the value of the hold current $I_h$ is set to a nominal value equal to the minimum current required to hold the coil in the open position.

Figure 2:
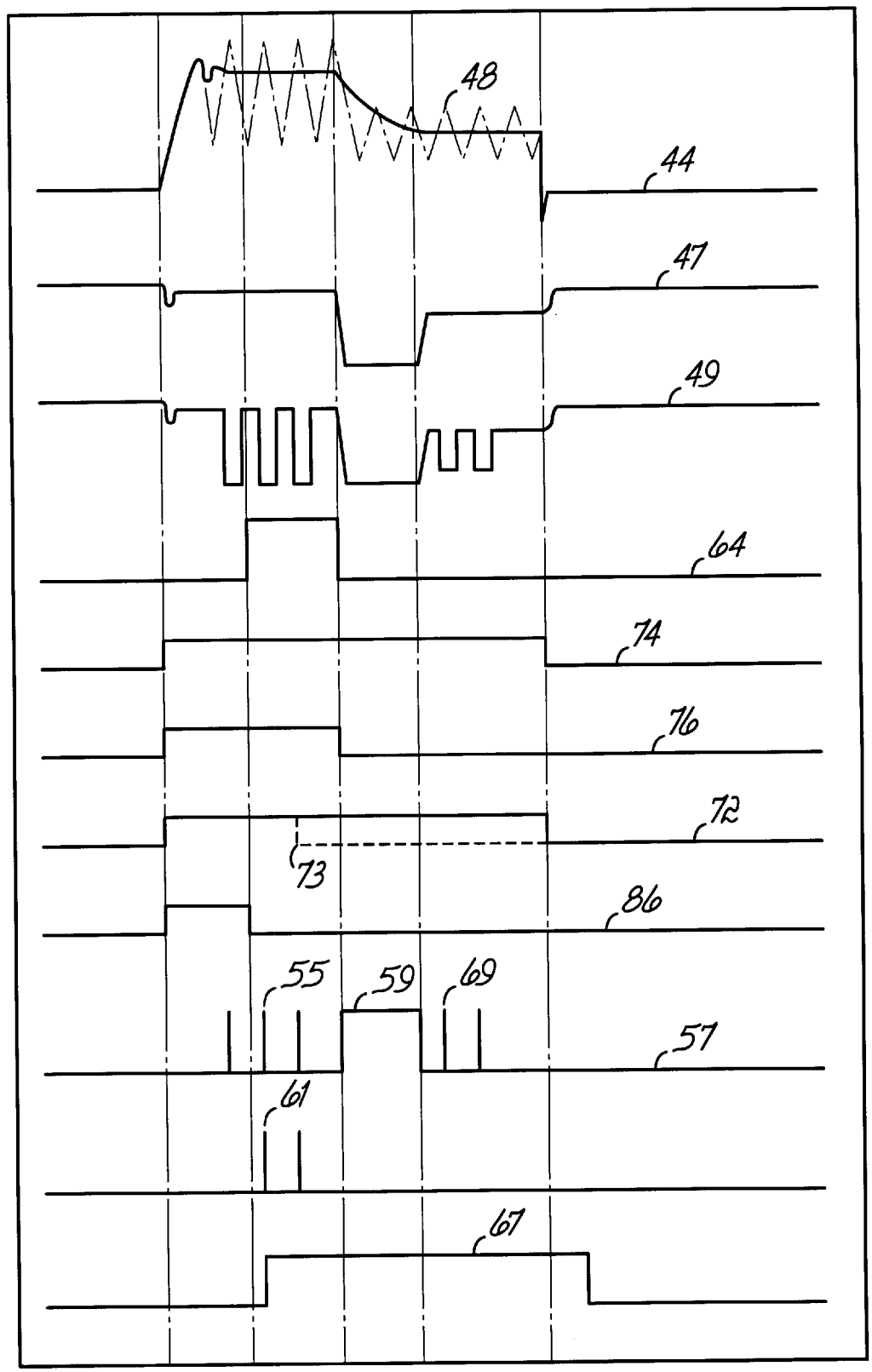
FIG. 2 illustrates waveforms of various signals in the driver and diagnostic circuits of FIG. 1.

As will be appreciated, the waveform 44 illustrated in FIG. 2 is for purposes of discussion and the real waveform consists of exponential functions that transition the current between levels. The real time, on-time wave shape can look radically different from the idealized waveform 44 of FIG. 2, depending on many factors such as $I_{pk}$, $I_h$, $T_{pk}$, $T_{on}$, $T_p$, $L_{coil}$, $R_{coil}$, etc. The $T_{on}$ and $T_p$ are related to the adhesive pattern required for a particular product. The inductance and resistance of the coil are a function of the gun itself, and the $I_{pk}$ is normally bounded by various considerations of the fluid dispenser 20 such as magnetic saturation, thermal considerations or force requirements.

Initial values of magnitudes of the peak and hold currents are based on the coil specifications, however, the peak current magnitude $I_{pk}$, the magnitude of the hold current $I_h$ and the duration of the peak current $T_{pk}$ may be adjustable by the user. The user may adjust the current waveform and the dispensing line rate in order to tune the dispensing operation to its peak performance.

In the embodiment of FIG. 1, a diagnostic circuit 46 for performing a low impedance diagnostic is electrically connected to the gun driver circuit 22. The diagnostic circuit 46 monitors the difference signal on the output 38 of the feedback amplifier 39 and detects a low impedance error condition by sampling or monitoring each output signal waveform provided by the power switching circuit 26 to the coil 24. It has been observed that when the impedance of the output circuit that includes the coil 24 is matched to the driver circuit 22, the difference signal from the error amplifier 39 has a waveform generally represented by the waveform 47. However, as the impedance of the output circuit of the coil 24 drops below a value representing a matched impedance with the driver circuit 22, the output signal experiences oscillations 48 as indicated in phantom in the waveform 44. Further, the amplitude of the oscillation increases as the impedance of the output circuit decreases further, that is, as the impedance mismatch worsens. As represented by the waveform 49, those oscillations also occur in the difference signal from error amplifier 39. The diagnostic circuit 46 detects each one of the oscillations that exceed a reference or threshold magnitude and provides an error signal representing a low impedance on an output 50 to a user indicator 52. The indicator 52 may be an LED or other sensory perceptible display, a relay, etc. Thus, the diagnostic circuit 46 functions to detect an unacceptably low impedance in the coil 24.

Figure 3:
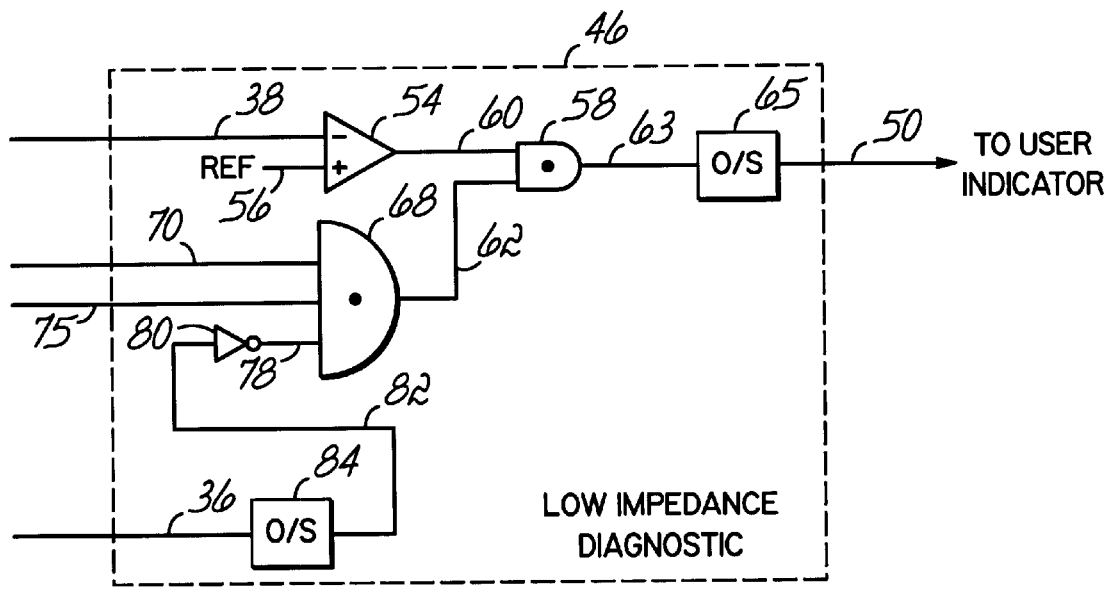
FIG. 3. is a logic flow diagram of the diagnostic circuit of FIG. 1.

Referring to FIG. 3, the diagnostic circuit 46 has a comparator 54 with a first input receiving the difference signal from the output 38 of the feedback amplifier 39. A threshold or reference signal is provided on a second input 56 of the comparator 54. The magnitude of the reference signal is chosen such that, any time the difference signal swings past the threshold value on input 56, the comparator 54 produces an output signal 55 of waveform 57 representing a low impedance error condition. However, the normal waveform 44 experiences a transition as the signal magnitude drops from the peak current value to the hold current value. Generally, during that transitional period, the difference signal 47 from the feedback amplifier 39 crosses the threshold on input 56, thereby producing an output from the comparator 54 as indicated by the signal 59 of the waveform 57. Such a transition is normal and should not be detected as an error. Therefore, any low impedance discrimination by the diagnostic circuit 46 must occur outside the transition period between the peak current and hold current levels. Consequently, the diagnostic circuit 46 is effective to detect a low impedance condition in the driver output circuit during the peak current period of the difference signal on line 38.

As can be seen from the waveform 44, the initial portion of the peak current experiences some instability prior to settling to a relatively constant magnitude. Consequently, it is desired that any monitoring or sampling of the peak current occur during the more stable latter portion of the peak current period. Thus, the diagnostic circuit 46 has an AND gate 58 with one input connected to the output 60 of the threshold comparator 54. A second input 62 of the AND gate 58 is provided with a peak sample signal having a waveform 64 that coincides with the more stable latter portion of the peak current signal. Thus, if a latter portion of the peak duration of the difference signal experiences a transition that crosses the threshold on input 56, an error signal 61 is provided from the AND gate 58 to a one-shot multivibrator 65. The one-shot multivibrator 65 then switches state and provides an output error signal 67 over output 50 to the user indicator 52. After a period of time determined by one-shot multivibrator 65, the output 50 is switched to its default or initial state.

The peak sample pulse provided on the input 62 of AND gate 58 is created by an AND gate 68. The system control 34 provides a trigger signal over output 36 to the timing logic within the control circuit 28 represented by waveform 74. When operating in a bead application mode, the trigger signal defines the duration of the output signal from the gun driver 22 and hence, the on-time of the dispensing gun. The AND gate 68 has a first input 70 connected to the timing logic 35 within the control circuit 28 that provides a switching signal represented by waveform 72. In the bead application mode, the on-time of the switching signal waveform 72 is the same as the trigger waveform 74. In a dot application mode, the leading edge of the trigger waveform 74 triggers the leading edge of the switching signal waveform 72. However, the timing logic within the control circuit 28 controls the trailing edge of the switching signal waveform 72. Thus, whether in the bead application mode or the dot application mode, a leading edge of the trigger signal initiates a waveform 44 to open the dispensing gun 25. However, in the dot application mode, the output signal 44 from the gun driver 22 is turned off and the dispensing gun 25 is closed by the trailing edge of the switching signal 42. Thus, as shown in phantom at 73, the trailing edge of switching signal can vary as a function of the parameters of the dot application mode.

The AND gate 68 has a second input that is connected to an output 75 of the timing logic 33 that provides a peak current duration signal as generally represented by the waveform 76. A third input 78 of the AND gate 68 is connected through an inverter 80 to an output 82 of a one-shot multivibrator 84. The one-shot multivibrator 84 has an input connected to the output 36 providing the trigger signal from the system control 34. The leading edge of the trigger signal causes the one-shot multivibrator 84 to switch on or true as indicated by the waveform 86. After a period of time determined by the one-shot multivibrator 84, its output 82 returns to its initial false or off state. The combination of the inputs to the AND gate 68 are effective to provide on its output 62 a peak sample pulse as generally represented by the waveform 64.

The one-shot multivibrator 84 provides a delay or hold off period of waveform 86 from the leading edge of the trigger waveform 74 during which the sampling process is disabled. At the end of the one-shot period, the input 78 goes true, thereby creating the leading edge of the peak sample pulse in waveform 64. At the end of the duration of the peak current, the trailing edge of the waveform 76 goes false, thereby providing a trailing edge for the peak sample pulse 64. However, in the dot application mode, as shown by the transition 73, the trailing edge of the switching signal can change state prior to the end of the peak current duration signal of waveform 74. As will be appreciated, in that event, the sample pulse has a shorter duration corresponding to the transition 73; and the sampling process described herein is similarly shortened.

Figure 4:
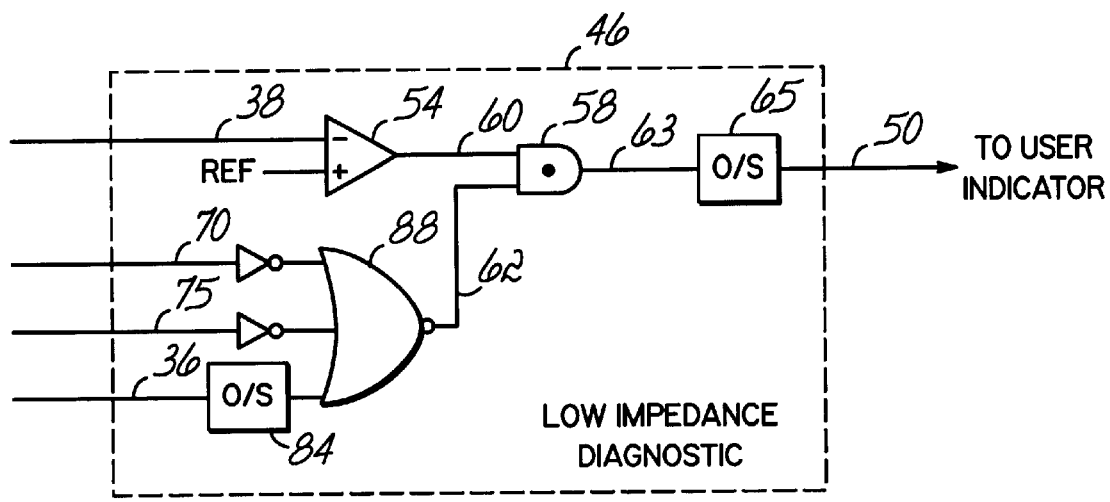
FIG. 4 is a an equivalent logic flow diagram of the diagnostic circuit of FIG. 1.
Figure 5:
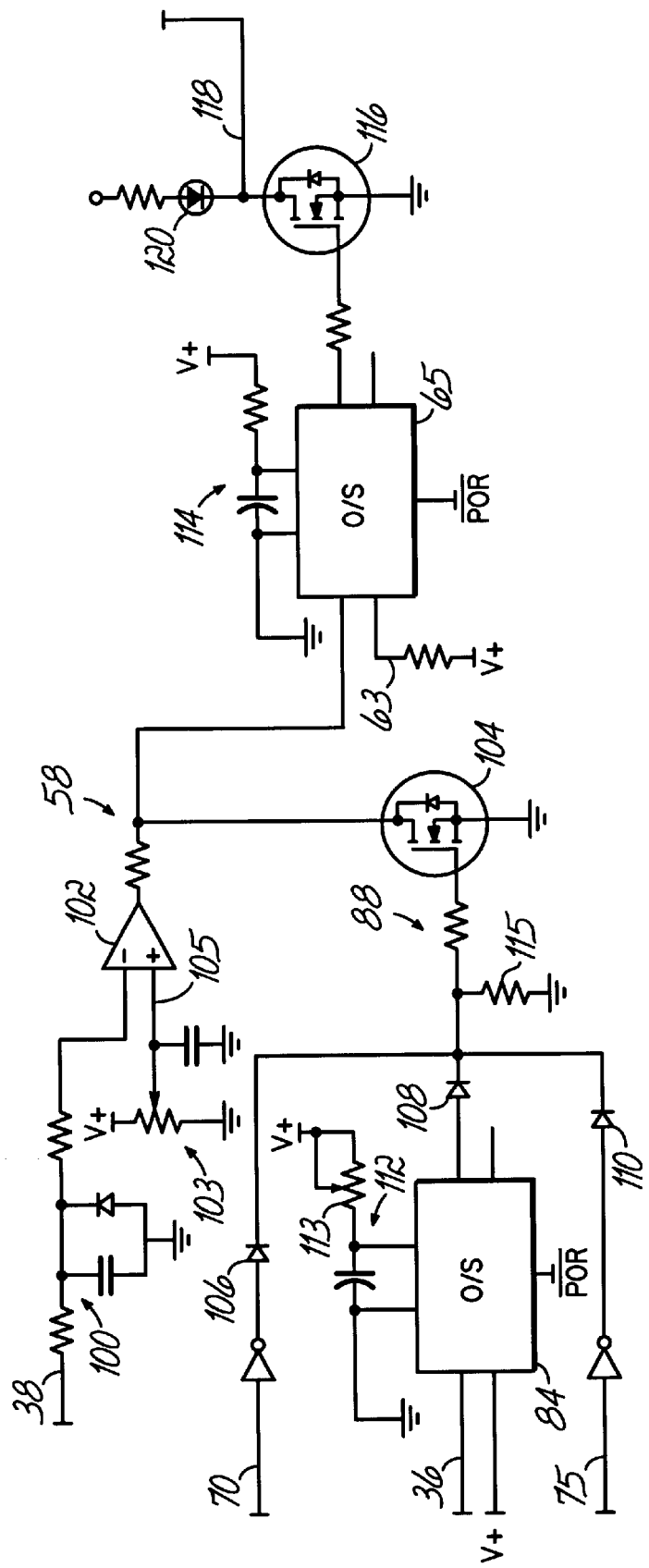
FIG. 5 is a detailed schematic diagram of one embodiment of the diagnostic circuit of FIG. 1.

An equivalent logic circuit for the diagnostic circuit 46 is illustrated in FIG. 4 in which a first circuit having NOR gate 88 and one-shot multivibrator 84 is used to create the peak sample pulse waveform 64. A low impedance error signal is produced by a second circuit having AND gate 58. The logic flow diagram of FIG. 4 may be implemented with the circuit illustrated in FIG. 5. The difference signal on line 38 first passes through a low pass filter 100. The filter cut off is determined by noise, the switching frequency of the driver, typical loads and other factors. The filtered difference signal is then input to a comparator 102 that has a second input connected to a variable voltage source 103. The variable voltage source 103 provides a desired threshold or reference signal on the second input of the comparator 102. The variable voltage source 103 may be implemented with a manual potentiometer, a digital potentiometer, a programmable potentiometer, a digital-to-analog converter, etc.

As previously discussed, if the impedance of the output circuit of the coil 24 drops below a desired matched impedance value, the difference signal 49 experiences oscillations 49; and the comparator 102 provides an output spike 55 each time an oscillation crosses a threshold on input 105. A NOR gate function is provided by the diodes 106, 108, 110, switch 104, and the resistor 113.

The RC circuit 112 is selected to provide the desired delay or hold off time from the one-shot multivibrator 84 as represented by the waveform 86. The RC circuit 112 includes a variable resistance source 113 that may be implemented with a manual potentiometer, a digital potentiometer, a programmable potentiometer, etc. The delay inhibits the start of the sample signal 64 until a more stable portion of the peak duration. Different dispensing guns have substantially different inductance values, and therefore, the leading edge of the peak current pulse will take correspondingly different times to ramp up to the desired peak value. The variable resistance source 113 can be used to adjust the delay and set the delay to match a particular dispensing gun being used. Further, a programmed setting for the variable resistance source 113 can be stored with other stored specifications for a particular gun; and the desired voltage is automatically set upon the particular gun being identified to the system control 34. Alternatively, the desired resistance valve can be manually entered or set by the user. As will be appreciated, in other embodiments, a variable voltage source may be used. Alternatively, a fixed resistor network may also be used.

When the timing period of the one-shot multivibrator 84 expires, the output from diode 108 is low. If the outputs from diodes 106 and 110 are also low, the switch 104 changes to an open state. At that time, output signals 61 from the comparator 102 are presented to the input 63 of the one-shot multivibrator 65. The output signals 61 trigger the one-shot multivibrator 65 to provide an error signal as represented by the waveform 67. The one-shot multivibrator 65, in turn, operates a switch 116 to provide an output 118 representing a low impedance error condition. That error condition can also be represented visually to the user by illuminating an LED 120. The switch 104 remains closed during the peak sample period. At the end of the timing period of the one-shot multivibrator 65, as determined by the RC circuit 114, for example, 470 milliseconds, its output again changes state, which causes the switch 116 to return to its original state, thereby turning off the LED 120. The time period of the one-shot multivibrator 65 determines the frequency at which a low impedance condition can be indicated to the user. Thus, the time period of the one-shot multivibrator 65 is determined by several factors, for example, the desired responsiveness of the diagnostic circuit 46, the devices receiving the error signal, etc. The time period of the one-shot multivibrator 65 often has a range of about 0.102 seconds.

If during a subsequent output signal from the gun driver 22, the difference signal on input 38 experiences another threshold crossing, the comparator 102 cycles again, thereby initiating the operation of the one-shot multivibrator 65 and the switch 116. Hence, a second error signal is provided on the output 118 thus illuminating the LED for a second time.

In use, if the output circuit containing the coil 24 is improperly wired or, if the wires are damaged and shorted so that a low impedance load is connected to the gun driver 22, the difference signal 47 will experience oscillations. Each time an oscillation crosses the reference or threshold value in comparator 54, an error signal is output to the user indicating a low impedance. Similarly, if over time, wire insulation slowly degrades to the extent that windings within the coil become shorted, the diagnostic circuit will detect that reduced impedance; and an error signal will be presented to the user. Thus, the low impedance detection of the present invention monitors the driver load impedance with each operation of the dispensing gun, thereby providing a continuous and real time monitoring system.

In addition, the diagnostic circuit 46 is also capable of detecting an impedance mismatch between the output circuit containing the coil 24 and the driver circuit 22. As indicated earlier, an impedance mismatch between the gun and the output of the driver circuit 22 can lead to an inconsistent fluid dispensing process. While some impedance mismatch is acceptable, with the present invention, the variable voltage source 103 can be set to a threshold or reference value so that the comparator 54 discriminates an unacceptable impedance mismatch between a dispensing gun coil 24 and the driver circuit 22. With the low impedance diagnostic, the user is provided with a reasonable range of impedance mismatch and thus, gun interchangeability, thereby increasing the flexibility and versatility of the fluid dispensing system. However, the user is advised when a gun is connected that has electrical characteristics so severely mismatched to the driver circuit 22 that a fluid dispensing process utilizing that gun will probably be adversely affected, and therefore, the gun should not be used.

Within a narrow range of similar dispensing guns, every gun has an optimum peak current value. To broaden the range of applicability of the invention and provide more precise low impedance detection, the variable voltage source 103 can be set to provide a threshold value that is unique to a particular dispensing gun being used. Further, that threshold value can be stored as a part of stored specifications for a particular gun; and the threshold value is automatically set upon the particular gun being identified to the system control 34. Alternatively, the threshold value may be manually entered or set by the user. In addition, the threshold voltage can also be changed or set to accommodate a range of peak currents. For example, a desired peak current is, to some extent, application dependent. The desired peak current may change as a function of the viscosity of the fluid being dispensed. Again, the desired threshold value may be stored and automatically set or manually set by the user.

While the present invention has been illustrated by a description of various embodiments and while these embodiments have been described in considerable detail in order to describe a mode of practicing the invention, it is not the intention of Applicant to restrict or in any way limit the scope of the appended claims to such detail. Additional advantages and modifications within the spirit and scope of the invention will readily appear to those skilled in the art. For example, the described embodiment is effective to detect the state of the driver output circuit during the initial peak current duration. As will be appreciated, alternatively, the comparator 54 can also be used to detect low impedance conditions during the hold current duration. The reference threshold on input 56 can be set to optimize the detection of a low impedance condition during the hold current duration. Further, the AND gate 68 could be connected to the control circuit 28 of the gun driver 22 such that the oscillation in the output is sampled during the hold current period. Further, the one-shot multivibrator 84 can be used to delay the sampling of the oscillation in the output signal by the gate 58 until a stable portion of the hold current period. However, as will be appreciated, the lower magnitude of the hold current presents a signal to the comparator 54 that is closer in magnitude to the threshold value. Therefore, there is the possibility that the occurrence of noise or other irregularities during the hold current duration could cross the threshold on input 56 and be detected as an error signal by the comparator 54.

In the described embodiment of FIG. 3, the difference signal is compared to the reference signal and the result is then sampled with the peak sample signal. As will be appreciated, alternatively, the difference signal can be sampled with the peak sample signal; and the result compared to the reference signal. Thus, the diagnostic circuit 46 can be implemented using different logic circuits; and the logic circuit can be implemented using different circuit components. As will be appreciated, the diagnostic circuit can be implemented using digital and/or analog circuit components. For example, the circuit looking for an excessive oscillation could be implemented using a digital signal processor or a microprocessor that performs an FFT analysis and looks for frequencies above a certain amplitude. Further, as will be appreciated, fixed resistor networks that provide the desired voltages can replace the variable elements 103, 113.

Further, the impedance monitoring system of the present invention monitors the impedance with each operation of the dispensing gun. As will be appreciated, the impedance monitoring function can be implemented to operate intermittently. A timer can be used to turn the low impedance diagnostic circuit on and off as desired or as is appropriate with a particular application.

Therefore, the invention in its broadest aspects is not limited to the specific details shown and described. Consequently, departures may be made from the details described herein without departing from the spirit and scope of the claims that follow.

What is claimed is:

1. An apparatus for use with a driver circuit of a fluid dispenser, the apparatus detects a low impedance of a load connected to the driver circuit, the driver circuit has a power switching circuit providing an output signal to a coil in the load, the output signal results from a drive signal that has a waveform comprising a higher magnitude initial peak period followed by a lower magnitude hold period, the apparatus comprising:
   a diagnostic circuit connected to the driver circuit, said diagnostic circuit provides a low impedance error signal in response to detecting an oscillation in the output signal that crosses a signal threshold during an occurrence of the drive signal.

2. The apparatus of claim 1 wherein the driver circuit has a feedback circuit providing a difference signal as a function of a difference between the output signal and the drive signal, and said diagnostic circuit further comprises:
   a source of a reference signal; and
   a comparator responsive to said difference signal and said reference signal, said comparator producing said first low impedance error signal in response to detecting the oscillation in the output signal crossing a magnitude of said reference signal.

3. The apparatus of claim 2 wherein said source provides said reference signal with an adjustable magnitude.

4. The apparatus of claim 2 wherein said diagnostic circuit further comprises:
   a first circuit connected to the driver circuit for providing a gating signal during the higher magnitude initial peak period of the drive signal; and
   a second circuit connected to said comparator and said first circuit for producing said low impedance error signal during only the higher magnitude initial peak period of the drive signal.

5. The apparatus of claim 4 wherein said first circuit produces said gating signal during a stable portion of the higher magnitude initial peak period of the drive signal, and said second circuit produces said low impedance error signal during only the stable portion of the higher magnitude initial peak period of the drive signal.

6. The apparatus of claim 5 wherein said first circuit further comprises a one-shot multivibrator having an input triggered in response to a leading edge of the higher magnitude initial peak period of the drive signal, said one-shot multivibrator providing a delay of a leading edge of said gating signal until the stable portion of the higher magnitude initial peak period of the drive signal.

7. The apparatus of claim 6 wherein said one-shot multivibrator provides the delay with an adjustable magnitude.

8. The apparatus of claim 2 wherein said diagnostic circuit further comprises:
   a first circuit adapted to be electrically connected to the driver circuit for providing a gating signal during the lower magnitude hold period of the drive signal; and
   a second circuit electrically connected to said comparator and said first circuit for producing said low impedance error signal during only the lower magnitude hold period of the drive signal.

9. The apparatus of claim 8 wherein said first circuit provides said gating signal during a stable portion of the lower magnitude hold period of the drive signal, and said second circuit produces said low impedance error signal during only the stable portion of the lower magnitude hold period of the drive signal.

10. The apparatus of claim 9 wherein said first circuit further comprises a one-shot multivibrator having an input triggered in response to a leading edge of the lower magnitude hold period of the drive signal, said one-shot multivibrator providing a delay of a leading edge of said gating signal until the stable portion of the lower magnitude hold period of the drive signal.

11. An apparatus for use with a driver circuit of a fluid dispenser, the apparatus detects a low impedance of a load connected to the driver circuit, the driver circuit having a power switching circuit providing an output signal to a coil in the load, the output signal resulting from a drive signal that has a waveform comprising a higher magnitude initial peak period followed by a lower magnitude hold period, the apparatus comprising:
   a diagnostic circuit connected to the driver circuit, said diagnostic circuit providing a low impedance error signal in response to detecting an oscillation in the output signal that crosses a signal threshold during a stable portion of the higher magnitude initial peak period of the drive signal.

12. An apparatus for detecting a low impedance load in an output circuit that includes a coil of a fluid dispenser, the apparatus comprising:
   a driver circuit adapted to provide an output signal to the output circuit, the output signal resulting from a drive signal having a waveform comprising a higher magnitude initial peak period followed by a lower magnitude hold period; and
   a diagnostic circuit electrically connected to said fluid dispensing driver circuit for providing a low impedance error signal in response to detecting an oscillation on said output signal that crosses a signal threshold during the higher magnitude initial peak period of said drive signal.

13. The apparatus of claim 12 wherein said driver circuit further comprises:
   a feedback circuit adapted to be electrically connected to the output circuit and providing a difference signal as a function of a difference between said output signal and said drive signal.

14. The apparatus of claim 13 wherein said feedback circuit further comprises:

a detector adapted to be electrically connected to the output circuit and detecting said feedback signal through said coil in response to said output signal; and an error amplifier electrically connected to said detector and responsive to said drive signal, said error amplifier provides said difference signal as a function of a difference between said output signal and said drive signal.

15. The apparatus of claim 12 wherein said diagnostic circuit further comprises:

a comparator responsive to said difference signal and a reference signal and providing said low impedance error signal in response to detecting an oscillation in said output signal that crosses a magnitude of said reference signal;

a first circuit electrically connected to said driver circuit and providing a gating signal during the higher magnitude initial peak period of said drive signal; and a second circuit electrically connected to said comparator and said first circuit for producing said low impedance error signal during only the higher magnitude initial peak period of said drive signal.

16. A method of detecting a low impedance of a load on an output of a driver circuit of a fluid dispenser, the output being connected to a coil in the load and the driver circuit applying an output signal to the coil in response to a drive signal that has a waveform comprising a higher magnitude initial peak period followed by a lower magnitude hold period, the method comprising providing an error signal in response to detecting an oscillation in the output signal that crosses a signal threshold during the drive signal.

17. The method of claim 16 further comprising providing the error signal in response to detecting the oscillation in the output signal crossing the signal threshold during the higher magnitude initial peak period of the drive signal.

18. The method of claim 16 further comprising providing the error signal in response to detecting the oscillation in the output signal crossing the signal threshold during the lower magnitude hold period of the drive signal.

19. A method of detecting a low impedance of a load on an output of a driver circuit of a fluid dispenser, the output being connected to a coil in the load and the driver circuit applying an output signal to the coil in response to a drive signal that has a waveform comprising a higher magnitude initial peak period followed by a lower magnitude hold period, the method comprising:

providing an error signal in response to detecting an oscillation in the output signal that crosses a signal threshold during the higher magnitude initial peak period of the drive signal.

20. The method of claim 19 further comprising providing the error signal in response to detecting the oscillation in the output signal that crosses the signal threshold during a more stable portion of the higher magnitude initial peak period of the drive signal.

21. A method of detecting a low impedance of a load on an output of a driver circuit of a fluid dispenser, the output of the driver circuit being connected to a coil in the load and the driver circuit applying an output signal to the coil in response to a drive signal that has a waveform comprising a higher magnitude initial peak period followed by a lower magnitude hold period, the method comprising:

sampling the output signal during the higher magnitude initial peak period of the drive signal; and providing an error signal in response to detecting an oscillation in the output signal that crosses a signal threshold.

22. The method of claim 21 further comprising providing the error signal in response to detecting the oscillation in the output signal that crosses the signal threshold during a more stable portion of the higher magnitude initial peak period of the drive signal.

23. A method of detecting a low impedance of a load on an output of a driver circuit of a fluid dispenser, the output being electrically connected to a coil in the load of the fluid dispenser, the method comprising:

providing a drive signal having a waveform comprising a higher magnitude initial peak period followed by a lower magnitude hold period;

applying an output signal to the coil in response to the drive signal, detecting an oscillation in the output signal; and providing an error signal in response to detecting the oscillation in the output signal.

24. The method of claim 23 further comprising detecting the oscillation in the output signal crossing a signal threshold magnitude.

25. The method of claim 24 further comprising adjusting the signal threshold magnitude.

26. The method of claim 23 further comprising:

detecting the oscillation in the output signal crossing the signal threshold magnitude during only the higher magnitude initial peak period of the drive signal.

27. The method of claim 23 further comprising:

detecting the oscillation in the output signal crossing the signal threshold magnitude during only a stable portion of the higher magnitude initial peak period of the drive signal.

28. The method of claim 23 further comprising:

delaying detecting the oscillation in the output signal crossing the signal threshold magnitude for a period of time after a leading edge of the higher magnitude initial peak period of the drive signal.

29. The method of claim 23 further comprising:

detecting the oscillation in the output signal crossing the signal threshold magnitude only during a stable portion of the lower magnitude hold period of the drive signal.

30. A method of detecting a low impedance of a load on an output of a driver circuit of a fluid dispenser, the driver circuit being electrically connected to a coil in the load of the fluid dispenser, the method comprising:

providing drive signals wherein each of the drive signals having a waveform comprising a higher magnitude initial peak period followed by a lower magnitude hold period;

applying output signals to the coil in response to the drive signals; and producing a low impedance error signal in response to detecting an oscillation in one of the output signals crossing a signal threshold during the higher magnitude initial peak period of a corresponding one of the drive signals.

31. The method of claim 30 further comprising producing a difference signal as a function of a difference between the one of the output signals and the corresponding one of the drive signals.

32. The method of claim 31 further comprising:

detecting a feedback signal through the coil in response to the one of the output signals; and providing the difference signal as a function of a difference between the feedback signal and the corresponding one of the drive signals.

33. The method of claim 30 further comprising:

providing a low impedance error signal in response to detecting the oscillation in the one of the output signals crossing a magnitude of the signal threshold;

providing a gating signal representing the higher magnitude initial peak period of the corresponding one of the drive signals; and producing the low impedance error signal during only the higher magnitude initial peak period of the corresponding one of the drive signals.

34. A method of detecting a low impedance of a load on an output of a driver circuit of a fluid dispenser, the driver circuit being connected to a coil in the load, the method comprising:

providing drive signals wherein each of the drive signals has a waveform comprising a higher magnitude initial peak period followed by a lower magnitude hold period;

applying output signals to the coil in response to respective drive signals;

detecting a feedback signal through the coil in response to each of the output signals;

providing a difference signal as a function of a difference between each feedback signal and a corresponding drive signal;

sampling the difference signal during the corresponding drive signal; and providing an error signal in response to the difference signal crossing a signal threshold magnitude.

35. The method of claim 34 further comprising:

sampling the difference signal during the initial peak period of each drive signal; and providing the error signal in response to the difference signal crossing the signal threshold magnitude during the initial peak period.

36. The method of claim 35 further comprising sampling the difference signal during a later portion of the initial peak period of each drive signal.

* * * * *